United States Patent [19]

Matsuda

[11] Patent Number: 5,689,193
[45] Date of Patent: Nov. 18, 1997

[54] PROBE HEAD, METHOD FOR MANUFACTURING THE SAME, AND INSPECTING METHOD USING THE SAME

[75] Inventor: Kaoru Matsuda, Sakai, Japan

[73] Assignee: Tokyo Electron Limited, Japan

[21] Appl. No.: 504,558

[22] Filed: Jul. 20, 1995

[30] Foreign Application Priority Data

Jul. 2, 1994 [JP] Japan ................... 6-192117

[51] Int. Cl.$^6$ ................... G01R 1/04; G01R 31/28
[52] U.S. Cl. ................... 324/754; 439/66; 29/838
[58] Field of Search ................... 324/72.5, 758, 324/754; 439/66; 29/838, 844

[56] References Cited

U.S. PATENT DOCUMENTS 4,843,315  6/1989  Bayer et al. ................... 324/72.5

FOREIGN PATENT DOCUMENTS

1-295185  11/1989  Japan.

*Primary Examiner*—Ernest F. Karlsen
*Assistant Examiner*—Barry C. Bowser
*Attorney, Agent, or Firm*—Beveridge, DeGrandi, Weilacher & Young, LLP

[57] ABSTRACT

Probes include proximal ends electrically connected to the respective conductive patterns of said insulating substrate, and free ends for being contact with the respective electrode pads of the object. The probes can be buckled in such a manner that the free ends are brought into contact with the respective electrode pads of the object under a predetermined contact pressure. Probes are formed from a wire for wire bonding by means of a wire bonder, and include proximal ends wire-bonded to each corresponding conductive patterns on the insulating substrate, and free ends formed by being cut after the wire is wire-bonded to a dummy substrate.

14 Claims, 11 Drawing Sheets

PROBE HEAD, METHOD FOR MANUFACTURING THE SAME, AND INSPECTING METHOD USING THE SAME

BACKGROUND OF THE INVENTION

1. Field of the Invention

The present invention relates to a probe head for inspecting electrical properties of an object of inspection while the probe head is brought into contact with electrode pads of the object, a method for manufacturing the same, and an inspecting method using the same.

2. Information of the Related Art

As is generally known, a probe head for inspecting semiconductor devices, such as IC wafers, for electrical properties, is furnished with a large number of probes corresponding to electrode pads formed on each semiconductor device. For instance, tungsten is used as a material of the probes. In measuring the electrical properties of a semiconductor device by means of the probes, the semiconductor device is moved further toward the probes from the position of contact between the probes and the electrode pads. By doing this, the probes can be brought into contact with the pad surface of the semiconductor device under a predetermined contact pressure.

The probe head is obtained by manually arranging a large number of probes on a support base. The probes are fixed on the base by means of an adhesive agent, and their respective end portions are connected electrically by manual soldering. These operations are very troublesome.

With the recent rapid progress of high-density versions of semiconductor devices, such as IC chips, the arrangement pitch of electrode pads of the devices has become finer and finer, and the number of the electrode pads has increased considerably. In some 15-inch liquid crystal displays, among other liquid crystal TV displays, for example, as many as 5,000 electrode pads are used, and the diameter and arrangement pitch of probes on the probe head side are made finer correspondingly.

Naturally, therefore, it is too troublesome or difficult to arrange, adhesively fix, and solder the probes individually in many positions by manual operation. Since these probes must be accurately positioned with respect to one another, moreover, the finer arrangement pitch inevitably entails an increase in manual operation time, and hence, in manufacturing cost. In this connection, formation of the probes of a probe head intended for the inspection of the liquid crystal displays requires at least 100 hours of operation time.

SUMMARY OF THE INVENTION

The object of the present invention is to provide an improved probe head in which probes are buckled so that they can be brought into contact with an object of inspection under a predetermined contact pressure without changing their fine arrangement pitch during probe inspection, a method for manufacturing the same, and an inspecting method using the same.

In order to achieve the above object, according to the present invention, there is provided a probe head for inspecting electrical properties of an object of inspection while the probe head is brought into contact with electrode pads of the object, said probe head comprising:

an insulating substrate formed with a plurality of electrically conductive patterns;

a plurality of probes including proximal ends electrically connected to the respective conductive patterns of said insulating substrate and free ends for contacting the respective electrode pads of the object, said probes being buckled in such a manner that the free ends are brought into contact with the respective electrode pads of the object under a predetermined contact pressure; and a head body for accommodating these probes.

Also, according to another aspect of the present invention, there is provided a probe head for inspecting electrical properties of an object of inspection when the probe head is brought into contact with electrode pads of the object, said probe head comprising:

an insulating substrate formed with a plurality of electrically conductive patterns;

a plurality of probes formed from a wire for wire bonding by means of a wire bonder, and including proximal ends wire-bonded to each corresponding conductive pattern on the insulating substrate, and free ends formed by being cut after the wires are wire-bonded to a dummy substrate; and a head body for accommodating these probes.

Further, according to another aspect of the present invention, there is provided a probe head for inspecting electrical properties of an object of inspection when the probe head is brought into contact with electrode pads of the object, said probe head comprising:

an insulating substrate formed with a plurality of electrically conductive patterns;

a plurality of probes including proximal ends electrically connected to the respective conductive patterns of said insulating substrate and free ends for contacting the respective electrode pads of the object; and a head body including a plurality of grooves for guiding respective intermediate regions of the probes so as to buckle the probes when the respective free ends of the probes are brought into contact with the object.

Further, according to another aspect of the present invention, there is provided a method for manufacturing a probe head for inspecting electrical properties of an object of inspection when the probe head is brought into contact with electrode pads of the object, said method comprising the steps of:

wire-bonding one end of a wire to a conductive patterns of an insulating substrate;

stretching the wire over a head body;

wire-bonding the other end of the wire to a dummy substrate;

engaging the wire, with both ends thereof bonded to the substrates, in a groove of the head body; and cutting the other ends of the wire so that the wire may be used as a probe.

Further, according to another aspect of the present invention, there is provided an inspecting method comprising the steps of:

bringing free ends of probes of the probe head into contact with electrode pads of an object of inspection; and pressing the free ends of the probes against the electrode pads so that the probes are buckled and the free ends are elastically brought into contact with the electrode pads under a predetermined contact pressure.

As described above, according to the present invention, the probes are connected to the conductive patterns on the insulating substrate by wire bonding, such as ultrasonic bonding, thermocompression bonding, or a combination of these two methods. Wires used for the wire bonding are formed of a highly plastic material. Although gold (Au) or copper (Cu) wires with a diameter of, e.g., 20 to 50 μm may be used in the case where a fine arrangement pitch is required, the wire diameter is not limited to these figures. Each wire is first bonded to a conductive pattern region on the insulating substrate, in a predetermined position, by means of a wire bonder. Thereafter, the wires are stretched in a predetermined direction, and are secondly bonded to the dummy substrate by means of the wire bonder. The wires are inserted individually into the concave grooves in the head body in a manner such that their respective bonded end portions are positioned in conformity to the arrangement pitch of the probes. In the case where the probe diameter is within the aforesaid range, the arrangement pitch is adjusted to 50 to 105 μm, for example. Thereafter, the wires, fixed in their respective positions conformable to the arrangement pitch of the probes, are cut on the side connected to the dummy substrate, whereupon the distal end portions of the probes are obtained. Thus, wire bonding processes capable of positioning and accurate control of the welding position can be automated without requiring the conventional manual operations, such as the arrangement, adhesive fixation, soldering, etc. of a large number of separately prepared probes. Since the manufacturing time can be shortened, moreover, the operation cost can be reduced.

Each concave groove of the head body is formed in a manner such that its depth in the direction perpendicular to the arrangement pitch direction of the probes is greater enough than the diameter of the wire for each probe. Accordingly, the probes are buckled in the concave grooves without changing their arrangement pitch when the respective free ends of the probes are brought into contact with the object of inspection. As the probes are buckled in this manner, the probes and the object of inspection can be brought into contact with each other under the predetermined contact pressure, so that an appropriate probe inspection can be accomplished.

The probe head is provided with the cover means for covering the concave grooves in the head body. With this arrangement, the probes, once caught by the concave grooves, can be securely prevented from slipping out of the grooves. The depth of each groove on the free-end side of each corresponding probe, which is defined by the head body and the cover means, is adjusted to a value such that the probe is allowed substantially to move only in the axial direction thereof. In this arrangement, the free end portions of the probes which project from the head body move only in the axial direction to be compressed when they are brought into contact with the object of inspection, so that the position of contact with the object can be prevented from being shifted.

When the probes are overdriven to secure the predetermined contact pressure after the object of inspection and the probes are brought into contact, the probes can be buckled in the concave grooves of the head body so that they are elastically contracted for a length equivalent to the distance covered by the overdrive. Thus, the projections of the free ends of the probes from the head body are elastically compressed for the overdrive distance, so that the predetermined contact pressure can be secured.

BRIEF DESCRIPTION OF THE DRAWINGS

FIGS. 7A–7C are diagrams for illustrating processes of the probe head manufacturing method according the second embodiment, in which

FIGS. 10A and 10B are schematic views showing shapes of the distal ends of probes, in which

FIGS. 12A–12C are cross-sectional views of a probe head according to the second embodiment of the present invention, in which

FIGS. 15A–15C are diagrams for illustrating processes of the probe head manufacturing method according to the second embodiment, in which

DETAILED DESCRIPTION OF THE PREFERRED EMBODIMENTS

With reference to FIGS. 1 to 4, a detecting apparatus for a substrate of a LCD will be explained.

Figure 1:
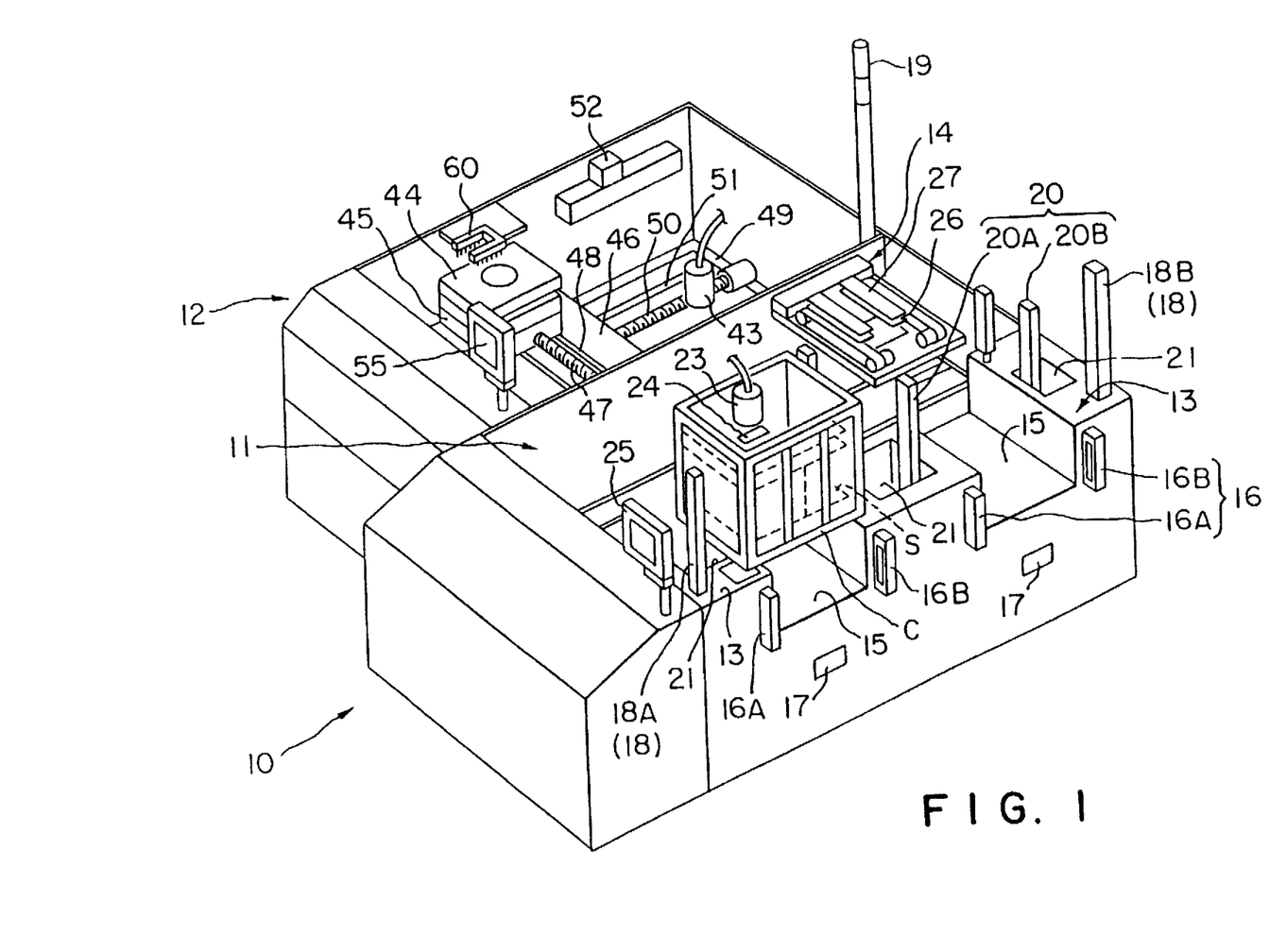
FIG. 1 is a perspective view showing an outline of the inspecting apparatus.

The inspecting apparatus 10 for the substrate of a LCD, as shown in FIG. 1, comprises a handling section 11 for loading and unloading the substrate S of a LCD, and an inspecting section 12 for electrically inspecting the substrate S of a LCD transferred from the handling section 11. The handling section 11 is located adjacent to the inspecting section 12. Further, the handling section 11 comprises a cassette mounting portion 13 for mounting a cassette C which accommodates a plurality of the substrates S, for example, 25 substrates, and a transferring device 14 for carrying the substrates S one by one from the cassette C to the inspecting section 12. The cassette C is provided at the whole front surface thereof with an opening portion for passing through the substrates S. The cassette C is provided at inner-side surfaces thereof with a plurality of supporting channels, not shown in the drawings, that are spaced with each other along upper and lower directions. The substrates S are inserted into the supporting channels and are supported in a horizontal direction by the channels.

The inspecting apparatus 10 receives the cassette C from an automatic transporting vehicle (not shown) and transfers the cassette C to the automatic vehicle. That is, the handling section 11 is provided, at a right side (right side in FIG. 1) with respect to a front side (left side in FIG. 1), with a pair of cassette mounting portions 13 for mounting the cassette C. If necessary, the handling section may have many more cassette mounting portions 13. Respective cassette mounting portions 13 are formed with concave portions 15 that are arranged in parallel to the inspecting apparatus and may accommodate the arms (not shown) of the automatic transporting vehicle. The arm having the cassette C descends in the concave portion 15, and the cassette C is laid on the cassette mounting portion 13 across the concave portion 15. Therefore, the wide length of the concave portion 15 is made larger than that of the cassette C. The automatic vehicle transfers the cassette C accommodating one unit of substrates S for a LCD, which have been treated in a precedent process, to the inspecting apparatus, according to information supplied from the host computer, not shown in the drawings. After the inspection, the automatic vehicle transfers the cassette C of one unit of substrates S. The cassette mounting portions 13 are provided with a positioning member, not shown in the drawings, for engaging the corner portion of the cassette C.

The handling portion 11 is provided with detecting devices 16 that can detect the cassettes C and are located at both sides of the concave portions 15. The detecting device 16 is constructed as a line sensor, and comprises an emitting portion 16A having a light emitting element, for example, a diode for emitting light, and a receiving portion 16B having a light receiving element for receiving a light ray emitted from the portion 16A. The portions 16A and 16B are located at both sides of the concave portion 15 so as to cross the cassette C, and the light ray emitted from the portion 16A is interrupted by the cassette C so that the portion 16B detects the cassette C. The handling portion 11 is provided with a light communicating means 17 that is arranged at a lower position of the concave portion 15 and communicates with the automatic vehicle by light ray so as to control the transferring of the cassette C.

The cassette mounting portion 13 is provided with an object detecting device 18 shifted outside on a mounting surface of the portion 13. The object detecting device 18 comprises a light emitting portion 18A arranged at the front side (left end side in FIG. 1), and a light receiving portion 18B arranged at the right side (right end side in FIG. 1). The object detecting device 18 is constructed as a line sensor for detecting the cassette C and any other objects by light ray between portions 18A and 18B. That is, when the cassette C is transferred from the automatic vehicle to the portion 13, the light ray emitted from the portion 18A is interrupted by the cassette C, so that a signal for receiving the cassette C is communicated to a computer described latter to control the driving portion of the transferring device 14. Further, when the light ray emitted from the position 18A is interrupted at a potion other than the passing region of the cassette C and the cassette C is detected by the cassette detecting device 16, a signal that an obstacle other than the cassette C has entered into the handling portion 11 is supplied to the computer. As a result, the operation of the respective driving portions is stopped, an alarm lamp 19, for example, a pilot light, is turned on, and further an alarm buzzer is turned on, so that the emergency is noted.

The cassette mounting portion 13 is provided with a counter 20 for counting the number of substrates S of a LCD accommodated in the cassette C. The counter comprises a light emitting portion 20A and a light receiving portion 20B, and these portions 20A and 20B are arranged in openings 21 formed on both sides of the concave portion 15. These portions 20A and 20B are mechanically connected under the concave portion 15 and are elevated by a driving mechanism (not shown), for example by a ball-screw. Therefore, while the counter 20 is elevated within the openings 21, the number of the substrates S is counted by the number of the interruptions of the light ray.

Also, a cassette identification device 23, for example, a bar code reader, is arranged above the cassette C. The identification mark 24, e.g., a bar code formed on the cassette C, is read by the cassette identification device 23 so that the substrates S of a LCD are identified as a lot unit. The detecting portion 12 is operated by the computer and controller of the detecting portion 12 according to the information read by identification device 23. The identification mark 24 represents detecting information. The handling portion 11 is displayed on a display device arranged in front thereof by a CCD camera provided in the handling portion 11. The display device 25 performs as an operating panel.

Figure 2:
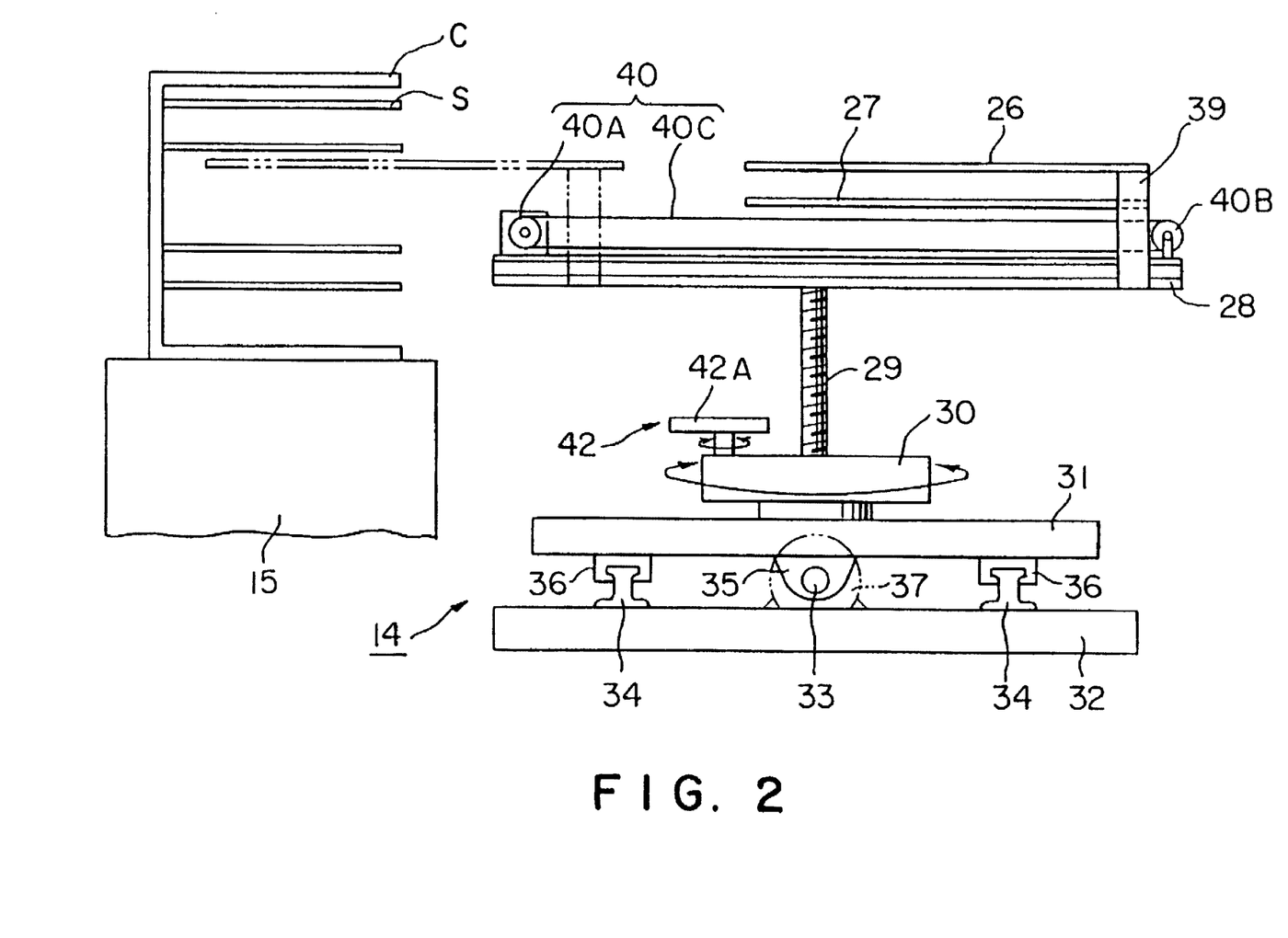
FIG. 2 is a side view of the transferring device assembled in the inspecting apparatus illustrated in FIG. 1.

The transferring device 14, as shown in FIG. 1, is arranged in a space defined between the cassette mounting portion 13 and the detecting portion 12 so that the transferring device 14 can be moved in directions of X, Y, Z, and θ within the space. The transferring device 14, as shown in FIG. 2, comprises a pair of arms 26 and 27 arranged in parallel with each other, and a plate 28 supporting the respective arms 26 and 27. When the transferring device 14 is stopping, the device 14 is directed to the Y direction perpendicular to the back direction (i.e., the X direction). The respective arms 26 and 27 can be moved on the supporting plate 28. The supporting plate 28 is connected to a rotating body 30 through a ball screw 29 constituting an elevating mechanism. Thus, the arms 26 and 27 can be elevated (in the Z direction) by the ball screw 29, and can be rotated positively or reversely in the θ direction by the rotating body 30. The ball screw 29 is rotated by a nut (or worm gear) and a motor not shown in the drawings.

The rotating body 30, as shown in FIG. 2, is arranged on a X table 31. The X table 31 is provided at the lower side thereof with a base 32 extended from the front side to the back side. The base 32 is provided at the upper side thereof with a ball screw 33 extending in the X direction from the front side to the back side, and a pair of rails 34 arranged on both sides of the ball screw 33. The ball screw 33 is engaged with a nut 35 mounted under the X table 31, and the pair of rails 34 are engaged with an engaging member 36 mounted under the X table. The X table 31 can be reciprocated along the cassette mounting portion 13 by a motor 37 connected to the ball screw 33.

The arms 26 and 27 have, as shown in FIG. 2, the same shapes, and respective arms 26 and 27 are independently driven. The upper arm 26 picks up the substrate S of the LCD from the cassette C, and loads the substrate S to a substrate mount of the inspecting section 12. The lower arm 27 unloads the substrate S finished from inspection from the substrate mount. Accordingly, the upper arm 26 is named a load arm, and the lower arm 27 is named an unload arm. Holes are formed on the arms 26 and 27. The substrate S of the LCD can be absorbed through an absorbing pipe and a vacuum exhaust device (not shown in the drawings) arranged under the arm.

The respective arms 26 and 27 are constructed to be identical with each other. The load arm 26 is connected to a Y direction driving mechanism through a connecting member 39, as shown in FIG. 2, so that the load arm 26 can be reciprocated on the supporting plate 28 along the Y direction. The Y direction driving mechanism 40 comprises a motor 40A arranged on a distal end portion of the longitudinal edge of the supporting plate 28, a rotating roller 40B arranged on a back end portion of the longitudinal edge of the supporting plate 28, and an endless timing belt 40C engaged between the motor 40A and the rotating roller 40B. The load arm 26 is connected through the member 39 to the timing belt 40C. The unload arm 27 is connected on the supporting plate 28 to a Y direction driving mechanism (not shown) constructed to be identical with the Y direction driving mechanism 40. Accordingly, the arms 26 and 27 can be independently reciprocated on the supporting plate 28 along the Y direction. The arms are respectively formed of electrical insulating members, e.g., plastic material. The Y direction driving mechanism 40 may be constituted by a ball screw, for example.

Also, a pre-alignment mechanism 42 that can be positively and reversely rotating along the θ direction is arranged on the rotating body 30. The substrate S of a LCD transferred from the cassette C can be pre-aligned by the pre-alignment mechanism 42 before the substrate is moved to the substrate mount of the inspection portion 12. A hole 42B for the vacuum exhaust is formed on a mount surface 42A of the pre-alignment mechanism 42 so that the substrate S can be absorbed by a vacuum through the hole 42B. An opening 29A that is opened over the pre-alignment mechanism 42 is formed on the supporting plate 28. When the load arm 26 and the unload arm 27 descend by the ball screw 29, the substrate S of a LCD is projected through the opening 29A over the supporting body 28 from the arms 26 and 27, and then is pre-aligned thereby.

Also, as shown in FIG. 1, a substrate identification device 43 which can read the identification mark, e.g., bar code (not shown), formed on a part of the circumferential edge of the substrate S supported on the load arm 26 is arranged on the way that the substrate S of the LCD is transferred from the cassette mounting portion 13 to the inspecting section 12. The substrate identification device 43 can identify the substrate S step by step so as to electrically inspect the substrate S according to the identification information, and then the identified substrate S is transferred to the inspecting section 12 by the load arm 26. The identification mark represents the information of the substrate S so that the substrate S is inspected according to the information by the inspecting section 12.

Further, as shown in FIG. 1, the inspecting section is provided with a substrate mount 44 that can be moved along the directions of X, Y, Z, and θ within a space defined in the inspecting section 12. That is, the substrate mount 44 is arranged on a Y table 45. The Y table 45 can be moved along the Y direction by means of a ball screw 47 and rails 48 arranged on a X table 46. The X table 46 can be moved along the X direction by means of a ball screw 50 and rails 51 arranged on the Y table.

Figure 3:
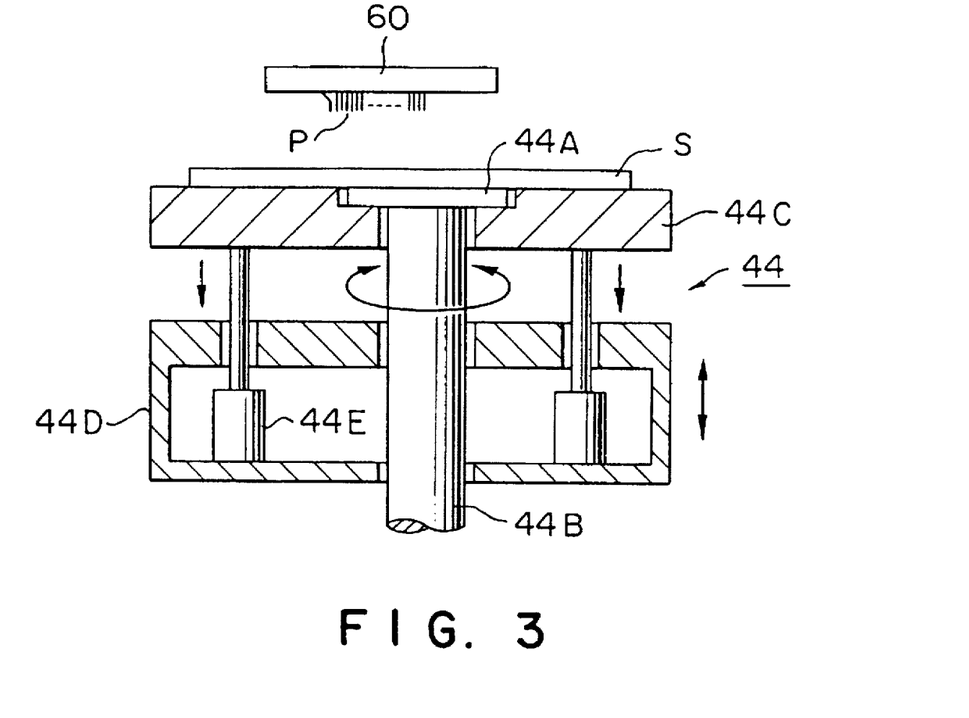
FIG. 3 is a cross-sectional view showing a condition immediately before a substrate of a LCD is brought into contact with a probe by means of a substrate mount of the inspecting apparatus illustrated in FIG. 1.

As shown in FIGS. 1 and 3, the substrate mount 44 comprises a rod 44B having a middle mount portion 44A shaped in a circle and arranged on the upper end of the substrate mount 44, a circumferential edge mount portion 44C shaped in a rectangle so as to surround the middle mount portion 44A, a housing body 44D arranged in the lower side of the mount 44, and a driving source, for example an air cylinder 44E arranged in the housing body 44D. The rod of the air cylinder 44E is connected to the lower side of the circumferential mount portion 44C, and the mount portion 44C descends from the middle mount portion 44A of the rod 44B by the air cylinder 44E. Therefore, in this embodiment, the mount surface 44c of the substrate mount 44 is divided into the middle mount portion 44A supporting the middle portion of the substrate S of a LCD, and the circumferential edge mount portion 44C supporting the substrate S at the circumference of the middle mount portion 44A. Further, the circumferential mount portion 44C is constituted to descend from the middle mount portion 44A through the air cylinder 44E.

Figure 4:
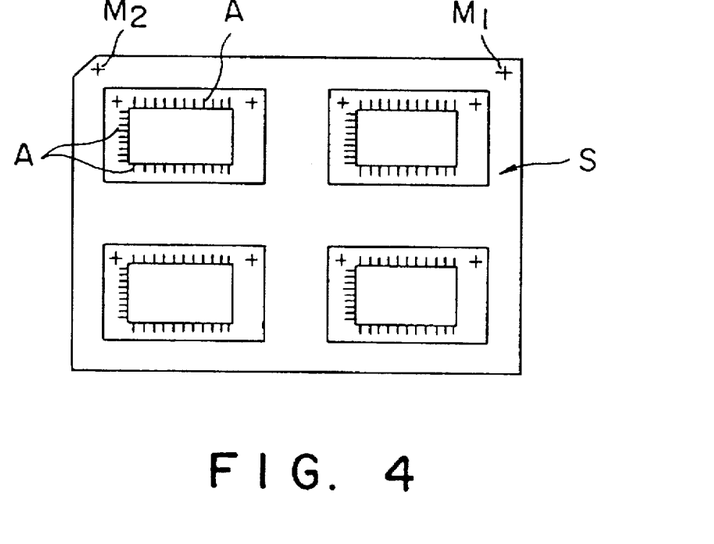
FIG. 4 is a plan view showing the substrate of a LCD.

Also, an alignment mechanism 52 having a thin and long shape is fixed at an alignment position in the inspecting section 12 and is extended along the X direction. When the substrate mount 44 holding the substrate S of a LCD arrives at the alignment position, the alignment mechanism 52 detects a pair of alignment marks (e.g., cross marks) M1 and M2 spaced from each other and formed at the edge of the substrate S, as shown in FIG. 4. The substrates S of a LCD can be aligned according to the cross marks M1 and M2. At the alignment, the alignment mechanism 52 cooperates with a CCD camera (not shown) arranged on the substrate mount 44.

Further, The CCD camera, as shown in FIG. 3, photographs the probes P of the probe head 60 so that the substrate mount 44 is aligned according to the pair of probes P that will become the reference at the inspection. This condition can be observed by a display device 55 arranged in front of the inspecting section 12. After the substrate mount 44, as shown in FIG. 3, moves the substrate S to the lower side of probes P of the inspecting section 12, the substrate mount 44 ascends so that the electrical pads A (as shown in FIG. 4) of the substrate S are brought into contact to the probes P so as to perform the electrical inspection. The distance between the substrate mount 44 and the probe can be detected by a height sensor (not shown), for example, an electrostatic capacity sensor.

Next, the operation will be explained.

In the case that the substrate of a LCD is inspected, the host computer transmits a signal for supplying the substrate of a LCD to the automatic transporting vehicle. The automatic transporting vehicle receives the substrate S of a LCD as a unit of cassette from the preceding process, and moves to the inspecting apparatus 10 so that the vehicle stops at a position opposing the communicating means 17 of the inspecting apparatus 10 as shown in FIG. 1. Thereafter, when the vehicle communicates with the inspecting apparatus 10 via the means 17, the inspecting apparatus 10 has a position waiting for receiving the cassette C. When the arm holding the cassette C starts to transport the cassette C into the inspecting apparatus, the cassette detecting device 16 detects the transportation of the cassette C, and the driving portion of the transportation device 14 start to drive. In the cassette mount portion 13, when the object detecting device 18 detects the cassette C, the driving portion continues to drive, and picks up the cassette C on the cassette mount portion 13. However, at this time, if the object detecting device 18 detects not only the cassette C but also an object other than the cassette C at the outside of the cassette passing region, the object is recognized to be an obstacle that is not necessary to the inspection, thereby stopping the respective driving portions for the emergency.

When the cassette C is mounted on the cassette mount portion without detecting another object, the cassette discrimination device 23 detects the bar code 24 to discriminate the substrate of a LCD to be inspected as a lot unit, and the discrimination result is transmitted to the control device of the inspecting section 12, thereby taking a waiting position for the inspection based on the discrimination result.

The object detecting device 18 detects the cassette C mounted on the cassette mount portion 13, as described above, and the detecting signal is transmitted to the computer.

On the other hand, the transferring device 14 directs the distal end to the cassette mount portion 13, and the load arm 26 and the unload arm 27 are positioned so as to be opposed vertically. The ball screw 29 of the elevating mechanism starts to drive. When the load arm 26 elevates together with the supporting plate 28 and arrives at the lower position of the substrate S of the LCD for the inspection, the ball screw 29 stops the drive. Continuously, the motor 40A of the Y direction driving mechanism positively rotates and the timing belt 40C rotates, so that the load arm 26 advances on the supporting plate 28 to enter the cassette C. The ball screw 29 starts to drive again and the load arm 26 lifts the substrate S of the LCD.

Thereafter, when the motor 40A of the Y direction driving mechanism 40 reversely rotates, the load arm 26 retreats through the timing belt 40C to a position of the load arm 27. While the unload arm 26 is retreating, the substrate S of the LCD is pre-aligned by the pre-alignment mechanism 42. After the load arm 26 has retreated, the transferring device 14 moves along the X direction and arrives at the alignment position of the inspecting section 12. At the same time, rotating body 30 rotates along the θ direction by 180 degree so that the distal end is directed to the inspecting section 12.

Continuously, the Y direction driving mechanism 40 starts the drive, and stops to drive at once before the load arm 26 advances to the alignment position. Thereafter, the Y direction driving mechanism 40 starts to drive again, and the substrate S of the LCD on the load arm 26 is transferred to the substrate mount 44. At this time, the circumferential edge mount portion 44C of the substrate mount 44 descends, the substrate S is held by the middle mount portion 44A, and the front surface of the substrate S is held by ascending of the circumferential edge mount portion 44C.

As described above, the substrate S of a LCD is held by the substrate mount 44, and the substrate S is aligned by the alignment mechanism 52. After the alignment, the substrate mount 44 moves to the lower side of the probes P of the probe head 60. Thereafter, the substrate mount 44 ascends and the electrical pads A of the substrate S are brought into contact with the probes P.

During the electrical inspection, the transferring device 14 moves to the cassette, picks up the next substrate therefrom to move to the alignment position, and then waits for finishing of the inspection. When the inspection is finished, the substrate mount 44 is opposed to the transferring device 14 waiting at the alignment position. Thereafter, the unload arm 27 of the transferring device 14 advances toward the substrate mount 44 to unload the substrate that has finished inspection, while the load arm 26 advances to load the substrate S, from which electrostatic charge has been removed, on the substrate mount 44. Thereafter, the same operation is repeated.

When the inspection for all of the substrates S in the cassette is finished, a signal for the finish of the inspection is transmitted from the control device of the inspecting section 12 to the host computer. Further, the host computer transmits the transporting signal to the automatic vehicle, so that the substrate which has finished the inspection is transferred from the inspection apparatus 10 by the automatic vehicle and then is transferred to the following process.

With reference to FIGS. 5 to 9, a first embodiment of the present invention will be described in detail.

Figure 5:
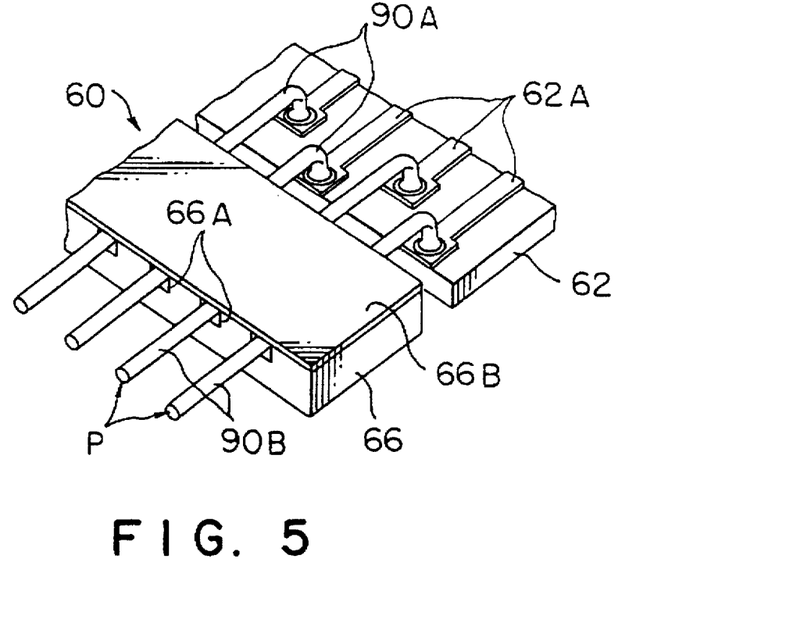
FIG. 5 is a perspective view showing a probe head according to the first embodiment of the present invention.

FIG. 5 shows an outline of a probe head according to the first embodiment. The probe head 60 is adapted for the inspection of a liquid crystal display (LCD) which includes many more electrode pads than an IC, for example. The probe head 60 mainly comprises an insulating substrate 62, probes P, a head body 66, and a cover 66B.

The insulating substrate 62 is formed with as many conductive patterns 62A as LCD-side electrode pads (not shown). Each conductive pattern 62A has a generally-known construction such that it comprises a metal film formed on an insulating substrate by plating or sputtering. In the present embodiment, gold is used as a material for plating and chromium for sputtering.

The insulating substrate 62 may be formed of a filmy insulating substrate with conductive patterns thereon. In the case where the object of inspection is a LCD substrate, for example, a TCP (tape carrier package) which is furnished with a LCD drive IC for the drive of the LCD substrate may be used directly as the filmy substrate.

Figure 6A:
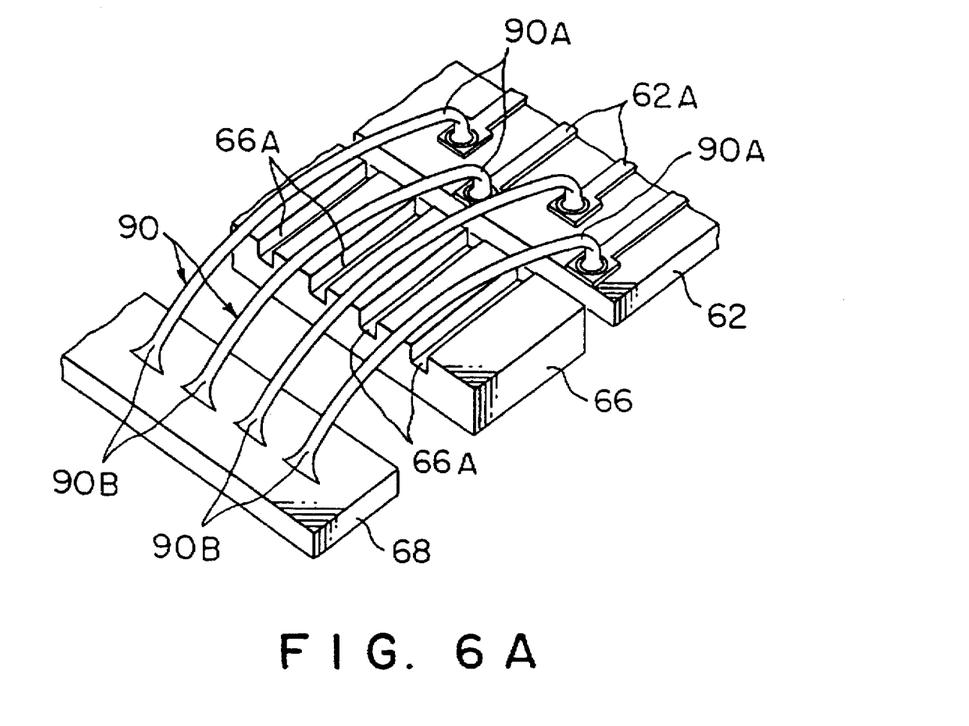
FIG. 6A is a perspective view schematically showing a process for manufacturing the probe head illustrated in FIG. 5.

Each probe P, as shown in FIG. 6A, is formed of a wire 90 which is bonded by means of a wire bonder. A fixed end 90A of the probe P is formed by firstly bonding the wire 90 to a corresponding conductive pattern 62A of the insulating substrate 62. A free end 90B of the probe P is formed by secondly bonding the other end of the wire 90 and then cutting it. In the case where the insulating substrate 62 is formed of the TCP, as mentioned before, the wire 90 is firstly bonded to a corresponding conductive pattern of the TCP in a direct manner. With use of the TCP, the LCD can be checked for lighting performance by utilizing the function of the LCD drive IC mounted on the TCP.

Figure 6B:
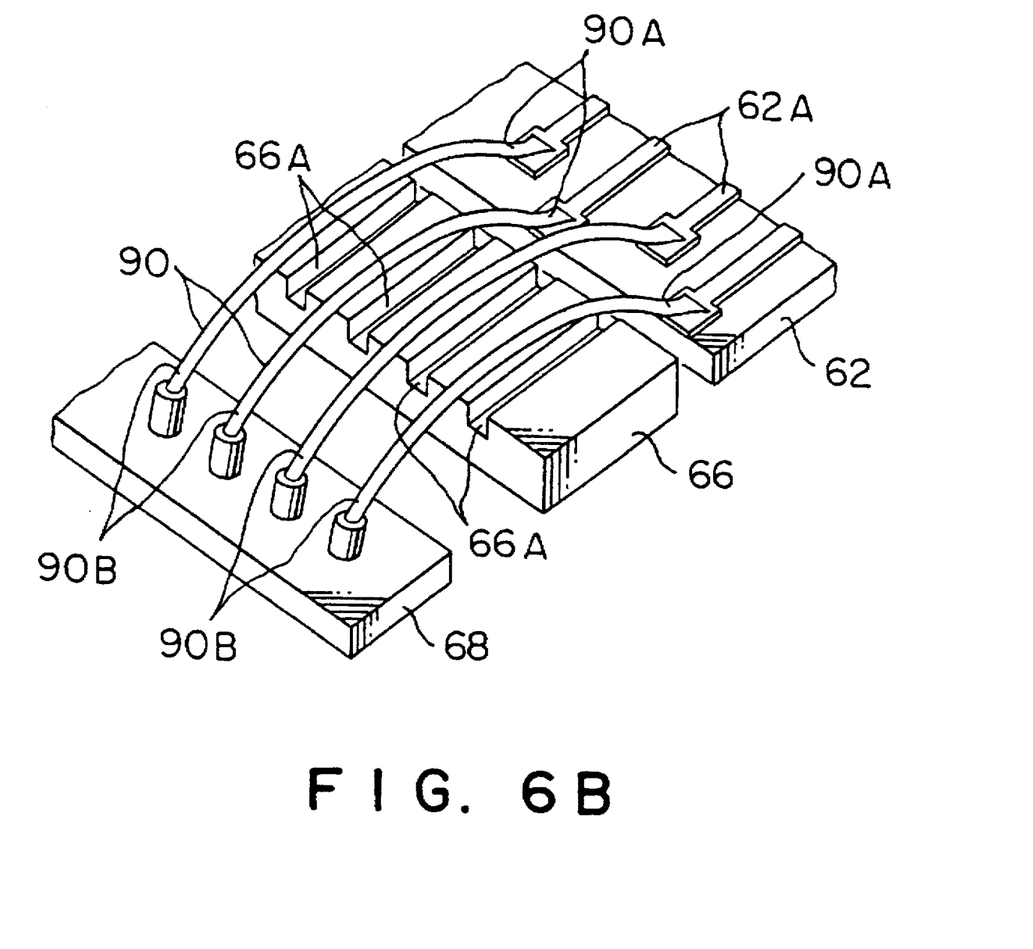
FIG. 6B is a perspective view schematically showing a process for manufacturing the probe head according to the modification of the second embodiment.

Also, as a modification of the first embodiment, as shown in FIG. 6B, the free end 90B of the probe P may be formed by firstly bonding, and then the fixed end 90A of the probe P may be formed by secondly bonding to each corresponding conductive pattern 62A of the insulating substrate 62. This reason is as follows. As shown in FIG. 6A, in the case where the fixed end 90A is firstly bonded, the pitch of conductive patterns 62A is very narrow. Thus, the diameter of the ball at the first bonding is comparatively large, so that this turns disadvantageously to the bonding. With respect thereto, in the case of FIG. 6B, the disadvantage can be avoided.

A region of each probe P intermediate between the fixed and free ends 90A and 90B thereof is inserted in a corresponding one of aligning grooves 66A (concave grooves) which are formed in the head body 66. The aligning grooves 66A are arranged in conformity to the arrangement pitch of contact portions (e.g., transparent electrodes ITO) of the liquid crystal display. Each aligning groove 66A is just wide enough to allow the probe P to be inserted or press-fitted therein.

Figure 7A:
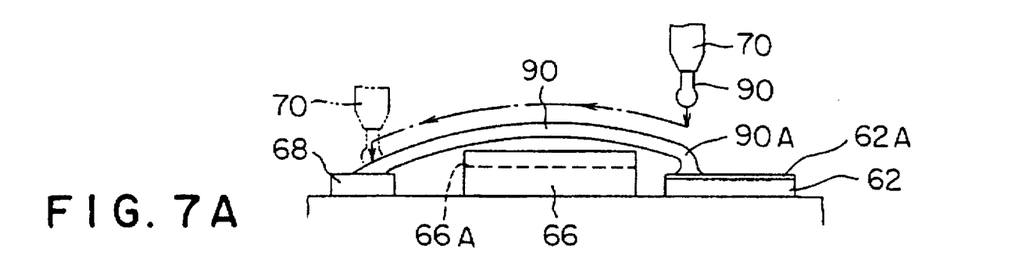
FIG. 7A shows first and second bonding processes.
Figure 7B:
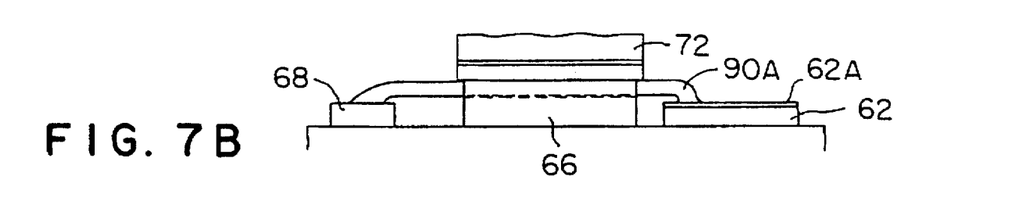
FIG. 7B shows a groove insertion process.
Figure 7C:
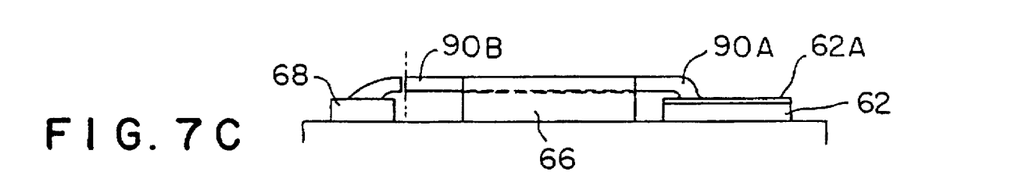
FIG. 7C is a cutting process.

FIGS. 7A–7C and the subsequent drawings show processes for manufacturing the probe head 60. First, the insulating substrate 62, the head body 66, and a dummy substrate 68, which is plated with a material having good bonding properties, such as gold, are prepared and fixed on a setup face of a manufacturing apparatus, as shown in FIG. 7A.

The head body 66 is formed of an insulating material such as ceramics. The aligning grooves 66A are formed on the head body 66 along the direction of the arrangement of the probes P by means of a dicing saw (circular saw). The dummy substrate 68, which has good bonding properties, is plated with a deposit of the same material for wires for wire bonding (mentioned later), and is located facing the insulating substrate 62 across the head body 66.

The probes P may be formed of, for example, a highly plastic alloy based on gold (Au) or hydrogen-reduced copper (Cu) treated with a corrosion inhibitor. In the present embodiment, the diameter D of the wires 90 used for wire bonding is adjusted to 20 to 50 µm, and their arrangement pitch is 50 to 120 µm based on the diameter. In the case of the insulating substrate 62 with the pattern dimensions shown in FIG. 9, for example, the minimum distance of a line pattern extending from each electrode pad is as short as 60 µm. In this case, therefore, the diameter and pitch of the wire 90 are set in consideration of this condition.

Based on the preliminary arrangement described above, the probe head 60 is manufactured in the processes shown in FIGS. 7A–7C.

Referring to FIG. 7A, the distal end of a capillary 70 is opposed to each conductive pattern 62A (see FIG. 6A) of the insulating substrate 62 which is fixed on the setup face of the manufacturing apparatus. When the leading end of the wire 90 touches the conductive pattern 62A of the substrate 62, the first bonding is executed. In this first bonding, the end portion of the wire is welded to the conductive pattern 62A by utilizing ultrasonic waves, thermocompression bonding, etc., for example.

When the end portion of the wire 90 is welded to the conductive pattern 62A of the insulating substrate 62, the capillary 70 moves in a predetermined direction, as indicated by dashed line in FIG. 7A, so that the other end of the wire 90 is brought into contact with the dummy substrate 68 with good bonding properties. This predetermined direction is a direction in which the wire 90 is stretched along each corresponding aligning groove 66A. In order to allow the capillary 70 to stride across the head body 66 without interfering with it, the intermediate portion of the wire 90 between the opposite ends thereof in the drawing direction is arched, and the other end of the wire 90 is brought into contact with the dummy substrate 68. Then, the other end of the wire 90 is welded to the substrate 68 by the second bonding in the same manner as in the aforesaid first bonding.

The wire 90, having its opposite ends welded individually to the insulating substrate 62 and the dummy substrate 68, is inserted into its corresponding aligning groove 66A of the head body 66 and aligned.

Figure 8:
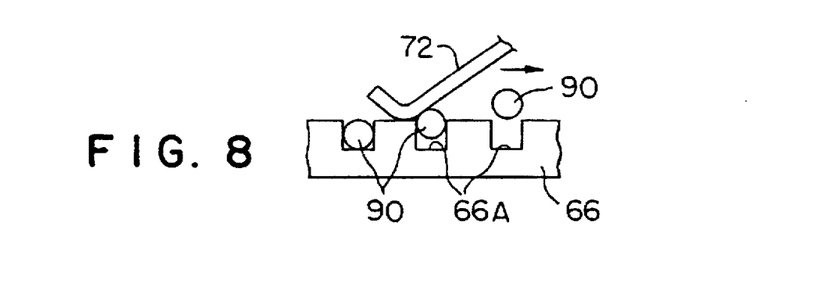
FIG. 8 is a side view showing the groove insertion process illustrated in FIG. 7B.

Referring to FIG. 7B, the arched wire 90 is forced into the aligning groove 66A as a sliding member 72 shown in FIG. 8 slides on the upper surface of the head body 66, for example. Thus, the wires 90 are positioned with respect to their arrangement direction by being inserted into their corresponding grooves 66A. The wires 90 are not always arched, and sometimes may be in contact with the upper surface of the head body 66. When the wires 90 are inserted in the grooves 66A, the respective openings of the grooves 66A are closed by the cover 66B, so that the wires 90 are securely prevented from slipping out of the grooves 66A.

Conventionally, the wire bonding itself is finished when both ends of each wire 90 are bonded. In the present embodiment, however, the bonded end portions of each wire are cut positively.

In the state shown in FIG. 7C, that end portion of the wire 90 which is situated farther from the insulating substrate 62 is welded to the dummy substrate 68 by the second bonding.

Figure 9:
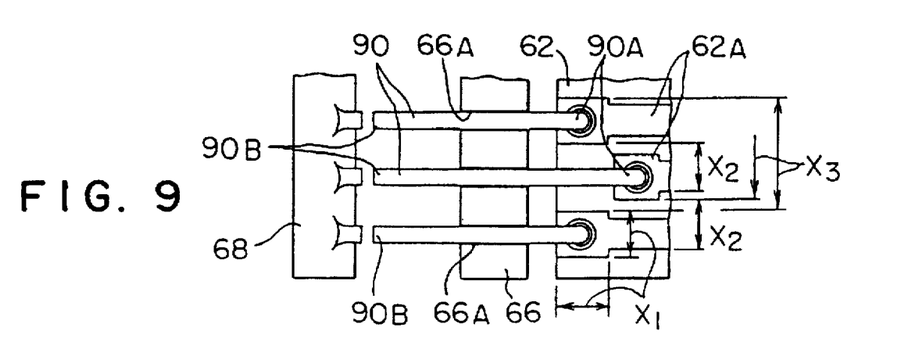
FIG. 9 is a schematic plan view showing the cutting process illustrated in FIG. 7C.

As shown in FIG. 9, however, the wires 90 are cut with their respective welded end portions left on the dummy substrate 68. That end portion of each wire 90 which is made to project from the head body 66 by the cutting forms the distal end of each probe P.

Figure 10A:
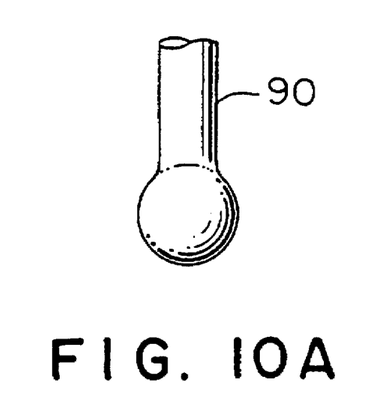
FIG. 10A shows a ball-shaped end.
Figure 10B:
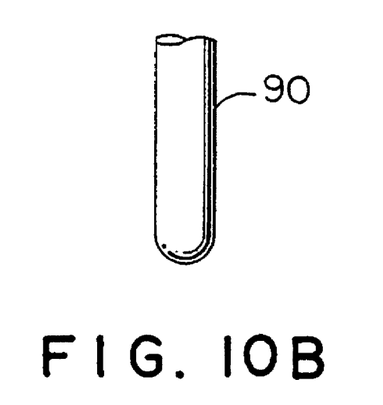
FIG. 10B shows a rounded end.

The wires are cut by means of, for example, a diamond cutter which is frequently used in the field. It is to be understood that the cut surface of each wire should have a suitable shape for appropriate contact with an electrode pad. The cutting process may be followed by a shaping process such that the cut end of the wire is ball-shaped, as shown in FIG. 10A, or rounded, as shown in FIG. 10B, for example. In this case, the shaping process may be a heating process using a torch or a polishing process based on electrolysis. A ball-shaped end is obtained by surface tension on the fused end when the heating process is selected, while a rounded end is obtained when the polishing process is selected.

As regards the case where the electrical properties of the liquid crystal display are measured, for example, the present embodiment has the following advantage. Some transparent electrodes on the liquid-crystal side are formed of ITO whose surface resistance is relatively high. The electrical properties of these electrodes are believed to be able to be measured without hindrance if accurate contact of the probe is ensured despite the existence of contact resistance. In the case where the probe is formed of gold (Au), therefore, the probe, unlike an aluminum electrode pad, must only be brought into contact without requiring a process for stripping off an insulating layer formed on its surface.

It is to be understood that the present invention is not limited to the first embodiment described above, and that various changes and modifications may be effected therein without departing from the scope or spirit of the invention.

For example, gold (Au), for use as a material of the wires for wire bonding, is lower in flexural rigidity and hardness than tungsten or the like. In the case where rigidity or hardness is required, therefore, necessary mechanical properties may be given to the wires by electroplating the wire surface with some other metal. For better mechanical properties, moreover, an evenly combined alloy of gold (Au) and copper (Cu) may be used as the material of the wires for the probes. By changing the mechanical properties in this manner, the present invention can be made to be applicable to elements whose properties can be measured on condition of their contact despite the existence of surface resistance, as well as the liquid crystal described in connection with the foregoing embodiment.

Figure 11:
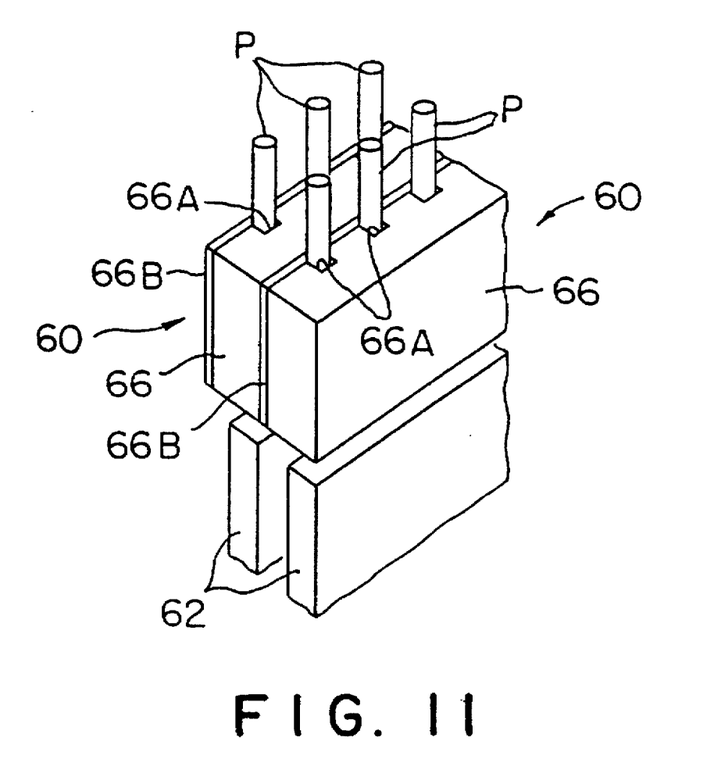
FIG. 11 is a perspective view showing an example adapted to the probe head according to the first embodiment.

In connection with the foregoing embodiment, moreover, a single probe head has been described as an object of the invention. For example, as shown in FIG. 11, a pair of single probe heads can be adhered with each other so as to produce a single probe head having a plurality of rows of probes. In this case, one row of probes is parallel with the other row of probes so that electrical pads having a matrix arrangement can be inspected. Also, FIG. 11 shows that a direction of the probe heads 60 is rotated reversely with respect to a direction for contacting the electrical pads.

The guide member, having the grooves in which the wires are press-fitted, is not limited to the arrangement in which the grooves are formed by means of a dicing saw, and may alternatively be obtained by molding a resin in a manner such that it has grooves. The wires may be press-fitted into the grooves after the cutting process.

According to the first embodiment of the present invention, as described above, the probe of the probe head is formed of the wire, and both ends of the wire are stretched and then adhered by the wire bonding. Thereafter, one end is cut to be defined to the distal end of the probe. Therefore, this does not require the conventional manual operations, such as the arrangement, adhesive fixation, soldering, etc. of a large number of separately prepared probes.

Further, even if the arrangement pitch of electrode pads of the devices has become finer and finer and the number of the electrode pads has increased considerably, wire bonding processes can be automated, so that the manufacturing time can be shortened, moreover, the operation cost can be reduced.

With reference to FIGS. 12 to 15, the probe head according to a second embodiment will be explained.

The probe head of the present embodiment has a structure almost same as that of the first embodiment. Thus, only the difference therebetween will be described.

In the present embodiment, also, as shown in FIGS. 12A, 12B, 12C, and 13, each probe P is formed of a wire 90 which is bonded by means of a wire bonder. A fixed end 90A of the probe P is formed by first bonding the wire 90 to each corresponding conductive pattern 62A of the insulating substrate 62. A free end 90B of the probe P is formed by secondly bonding the other end of the wire 90 and then cutting it.

A region of each probe P intermediate between the fixed and free ends 90A and 90B thereof is inserted in each corresponding one of aligning grooves 66A (concave grooves) which are formed in the head body 66. The aligning grooves 66A are arranged in conformity to the arrangement pitch of contact portions (e.g., transparent electrodes ITO) of the liquid crystal display. Each aligning groove 66A is just wide enough to allow the probe P to be inserted or press-fitted therein.

Figure 12A:
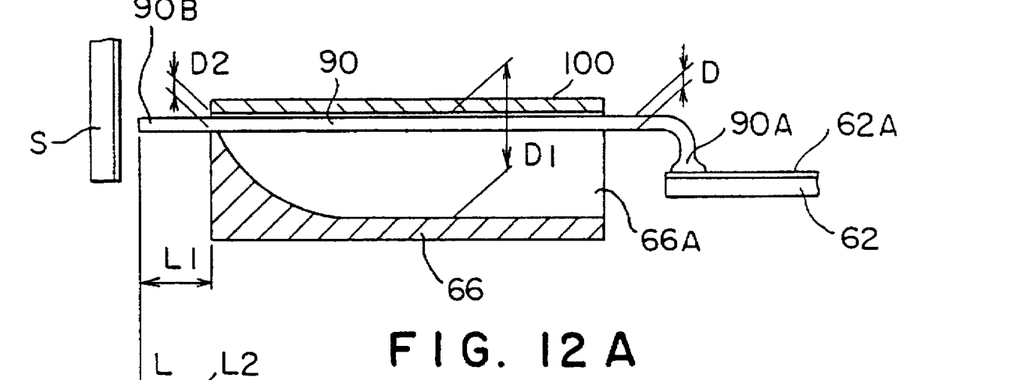
FIG. 12A shows a non-inspective state.

FIG. 12A is a cross-sectional view of one of the aligning grooves 66A of the head body 66. As shown in FIG. 12A, a maximum depth D1 of the groove 66A is larger enough than the diameter D of the probe P. Preferably, the maximum depth D1 of the groove 66A is adjusted to more than 300 μm, especially 500 μm, if the diameter D of the probe P is 20 to 50 μm. FIG. 12A shows a non-inspective state in which the free end 90B of the probe P is not brought into contact with an object S of inspection yet.

Figure 12B:
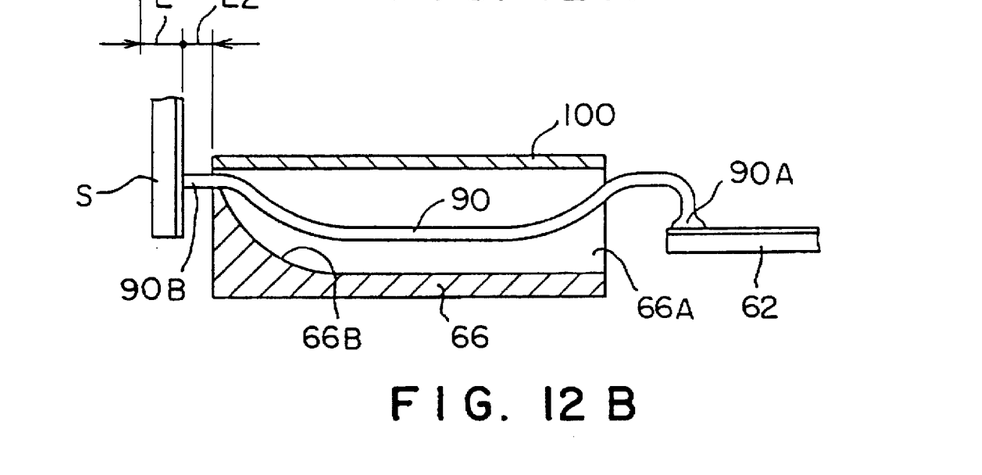
FIGS. 12B and 12C show an inspective state.

In contrast with this, FIG. 12B shows an inspective state established when the free end 90B of the probe P is overdriven by a distance L after it is brought into contact with the surface of the object S of inspection. As shown in FIG. 12B, the probe P is buckled by the overdrive in a manner such that the region of the aligning groove 66A with the maximum depth D1 serves as a buckling space. In the non-inspective state, as shown in FIG. 12A, the length of that portion of the probe P which projects from the head body 66 is L1. In the inspective state shown in FIG. 12B, on the other hand, the length of the projection of the probe P is L2. This is because the object S and the probe head 60 are relatively moved toward and brought into contact with each other and then overdriven by the distance L so that the projection of the free end 90B of the probe P is compressed. Thus, the projection length L2 for the inspection is given by L2=L1−L. The elastic compression of the projection of the free end 90B of the probe P is caused by the buckling of the probe P in the head body 66.

In other words, the maximum depth D1 of each aligning groove 66A of the head body 66 is adjusted to a value which allows buckling of the probe P such that the projection of the free end 90B of the probe P from the head body 66 is elastically contracted for a length equivalent to the overdrive distance L after the contact between the probe P and the object S of inspection.

By thus buckling the probe P in the head body 66, the object S of inspection and the probe P can be brought into contact with each other under a predetermined contact pressure at the time of the overdrive motion, and the arrangement pitch of the probe P can be maintained.

Preferably, the depth of each aligning groove 66A on the free-end side of the probe P is adjusted to a value D2 which is a little larger than the diameter D of the probe P. During the overdrive motion, therefore, the groove depth D2 allows the probe P to move only in the axial direction. Thus, the probe P only slides in the axial direction without buckling in this region. When the object S of inspection and the free end 90B of the probe P come into contact with each other, therefore, the probe P can be compressed without shifting the contact position. In order to ensure a smooth slide of the probe P in the region corresponding to the groove depth D2, the groove base may be given a low-friction configuration or formed with a high-slipperiness layer.

Figure 12C:
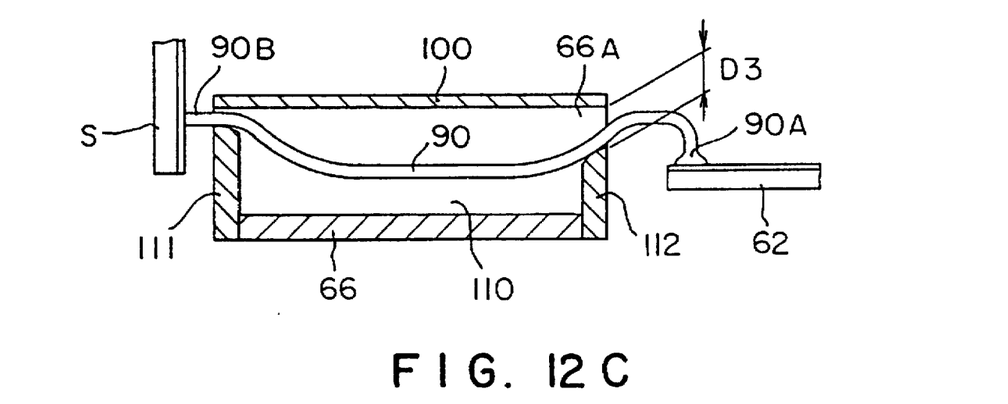
Figure 13:
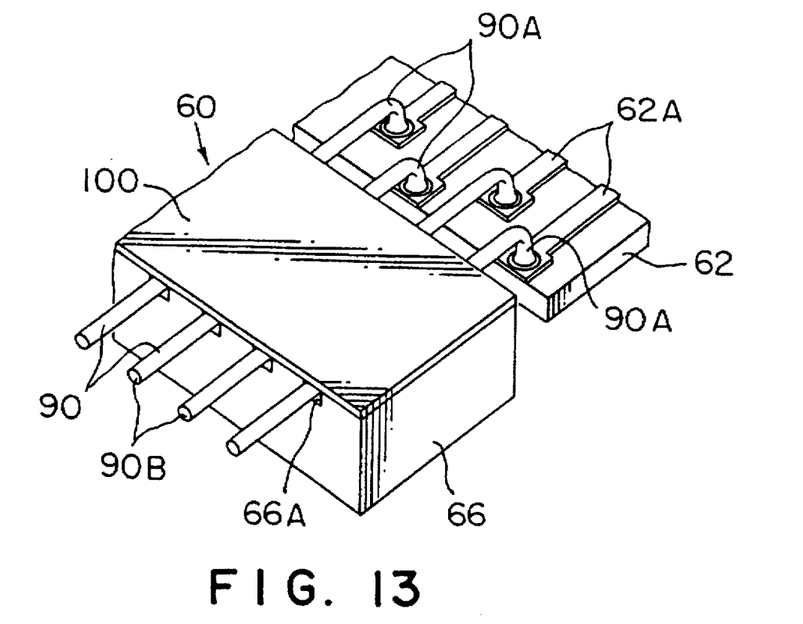
FIG. 13 is a perspective view showing an outline of the probe head according to the second embodiment of the present invention.
Figure 14:
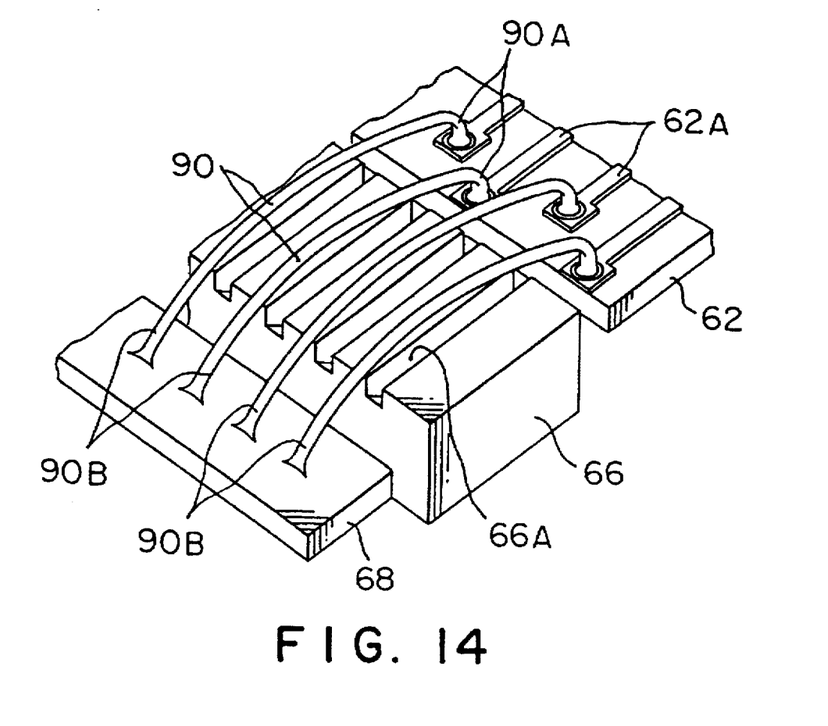
FIG. 14 is a perspective view schematically showing a process for manufacturing the probe head illustrated in FIG. 13.

In order to secure the depth D2 of each aligning groove 66A, part of the base of the groove 66A is formed as an arcuate surface 66B. If it is difficult to form the arcuate surface 66B by means of a dicing saw, the configuration shown in FIG. 12C may be used instead. Referring to FIG. 12C, the base of the aligning groove 66A is formed of a flat surface, and first and second partition walls 111 and 112 are fixed individually to opening portions at the opposite ends of the groove.

The first partition wall 111 serves to maintain the groove depth D2 on the side of the free end 90B of the probe P. With the use of the second partition wall 112, on the other hand, the groove depth on the side of the fixed end 90A of the probe P can be adjusted to a value D3 which is smaller than the maximum groove depth D1. Since the second partition wall 112 serves to prevent the portion of the probe P near the fixed end 90A from buckling, the fixed end 90A can avoid being subjected to an excessive load from the overdrive operation. Despite repeated use of the probe head P, therefore, the fixed end 90A of the probe P can be prevented from being disengaged from its corresponding conductive pattern 112 of the insulating substrate 62. According to the present embodiment, the probe inspection can enjoy high accuracy after 50,000 cycles of repetition of the inspection process which involves the overdrive operation.

Figure 15A:
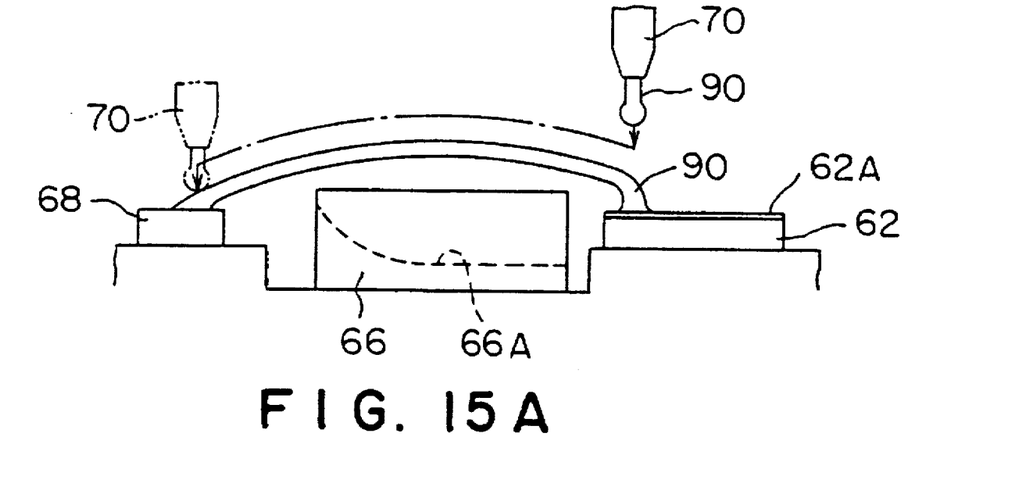
FIG. 15A shows first and second bonding processes.
Figure 15B:
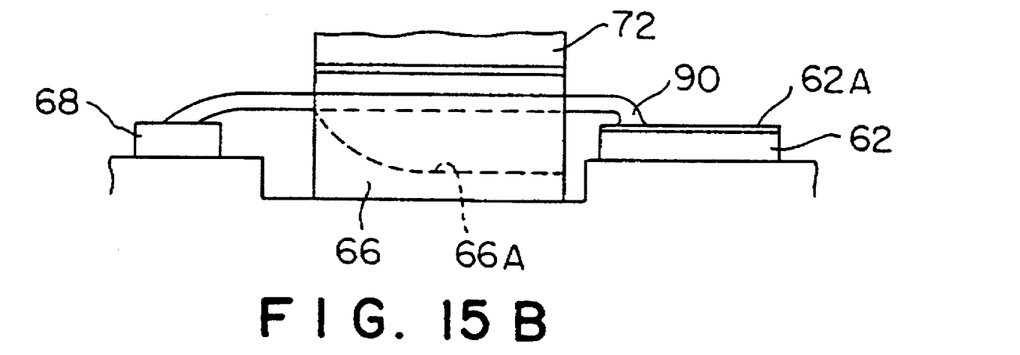
FIG. 15B shows a groove insertion process.
Figure 15C:
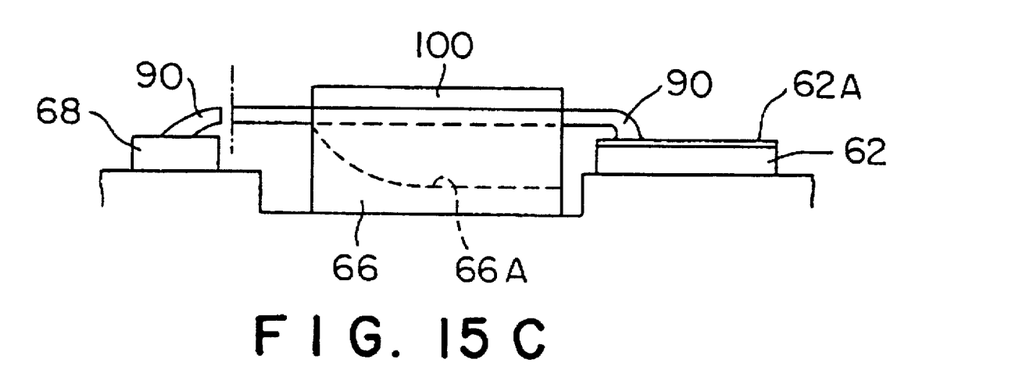
FIG. 15C is a cutting process.

FIGS. 15A, 15B, and 15C drawings show processes for manufacturing the probe head according to the second embodiment. The process of the second embodiment is almost same as that of the first embodiment. Thus, the description of the process is omitted.

It is to be understood that the present invention is not limited to the second embodiment described above, and that various changes and modifications may be effected therein without departing from the scope or spirit of the invention.

In connection with the foregoing embodiment, moreover, a single probe head has been described as an object of the invention. In examining the electrical properties of a liquid crystal display having contact portions on two long sides and one short side thereof, for example, however, it is necessary only that three probe heads 60 be arranged individually along those three sides in the shape of a U. In the case of a liquid crystal display having contact portions on one long side and one short side thereof, two probe heads 60 must only be arranged in the shape of an L. In the case of the L-shaped array, the arrangement pitch of the probes arranged along the long side is half that of the probes arranged along the long sides in the U-shaped array. According to the present embodiment, probe arrays with such fine pitches can be materialized at low cost.

Figure 16:
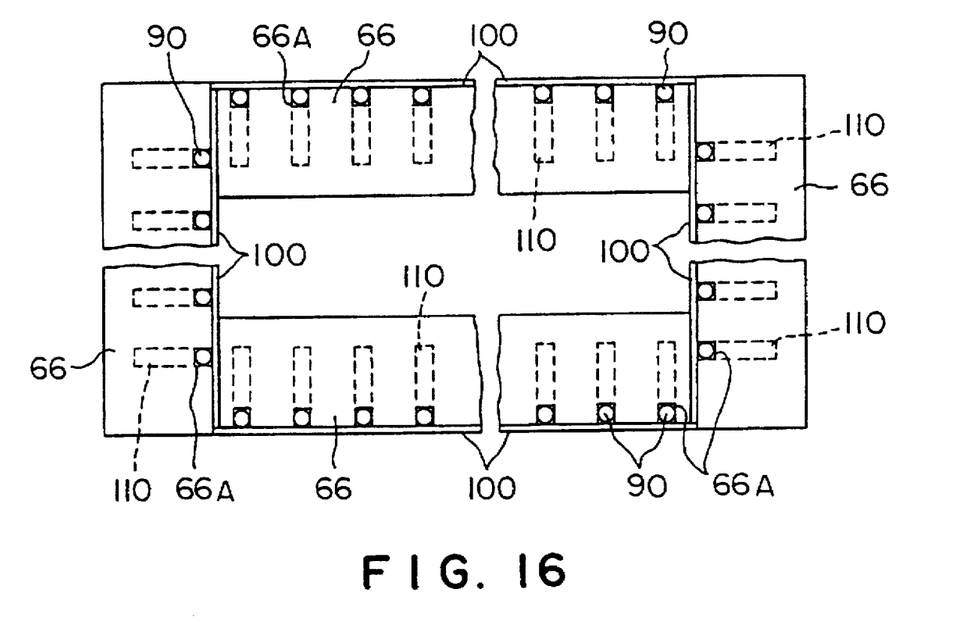
FIG. 16 is a schematic plan view showing an example of a probe head assembly combining a plurality of probe heads according to the second embodiment of the invention.

In inspecting semiconductor chips, such as IC chips, for electrical properties by means of probe heads 60, the probe heads 60 may be combined in the manner shown in FIG. 16. FIG. 16 is a plan view of a probe head assembly as viewed from the free-end side of probes P. This probe head assembly is used to inspect IC chips which have electrode pads on four sides thereof. The probes P are arranged in a line along each of the four sides of each IC chip. A large number of probe head assemblies shown in FIG. 16 may be combined to constitute a probe assembly in which IC chips on wafers can be touched collectively.

According to the second embodiment, as described above, a low-priced probe head can be obtained by forming the probes from the wires which are bonded by means of a wire bonder. By buckling the probes in the aligning grooves of the head body for finely aligning and supporting the probes, moreover, electrical contact under an appropriate contact pressure can be secured without changing the arrangement pitch.

Furthermore, according to the second embodiment, the probes can be buckled in the aligning grooves of the head body as the projections of the respective free ends of the probes are elastically contracted. Thus, inspection can always be conducted under an appropriate contact pressure.

Figure 17:
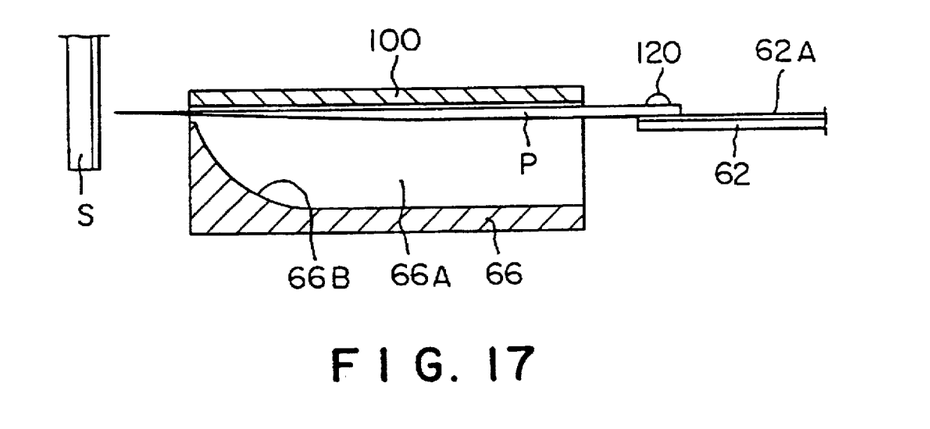
FIG. 17 is a cross-sectional schematic view of a probe head according to a modification of the second embodiment of the present invention.

With reference to FIG. 17, a probe head of a modification of the second embodiment of the present invention will be explained.

In the present modification, each probe P is not formed of a wire which is bonded by means of a wire bonder, and tungsten is used as a material of the probes. Further, the head body 66 has a aligning groove 66A with a arcuate surface 66B, the same as the second embodiment.

Especially, in the modification, the proximal end of the probe P is fixed by means of the soldering at a portion designated by 120 which is located at the end of the electrical pattern 62A of the insulating substrate 62. In this case, when the free end of the probe P is brought into contact with the objection of inspection, the probe can be buckled in the aligning grooves (concave grooves) 66A without changing the arrangement pitch. Thus, the buckling the probes causes the probe P and the inspection object S to bring into contact with each other under the predetermined pressure. Therefore, the appropriate inspection for the probe can be secured.

The present modification is adapted to the head body 66 having the aligning groove 66A with the arcuate surface 66B. It is to be understood, however, that the modification can be adapted to the head body constructed by the first embodiment.

What is claimed is:

1. A probe head for inspecting electrical properties of an object, said probe head comprising:
    an insulating substrate with a plurality of electrically conductive patterns formed thereon;
    a plurality of probes, each of the probes including a proximal end electrically connected to a corresponding one of said conductive patterns of said insulating substrate and a free end for contacting an electrode pad of the object; and
    a head body for accommodating the probes, the head body defining therein a plurality of concave grooves for holding the probes such that, when the probes are brought into contact with electrode pads of the object, the probes can buckle within the concave grooves so that the probes contact the electrode pads under a predetermined contact pressure.

2. The probe head according to claim 1, wherein each probe is formed of a wire, and the proximal end of each probe is bonded to a corresponding one of said conductive patterns by means of a wire bonder.

3. The probe head according to claim 1, wherein the proximal end of each probe is soldered to a corresponding one of said conductive patterns on the insulating substrate.

4. The probe head according to claim 1, wherein each concave groove is formed by cutting of a dicing saw.

5. The probe head according to claim 1, wherein the diameter of the probe is 20 μm to 50 μm, and the pitch of the probes is 50 μm to 120 μm.

6. The probe head according to claim 1, wherein a depth of each concave groove on a free-end side of the probe is smaller than a depth of the concave groove on a proximal-end side.

7. The probe head according to claim 1, wherein a maximum depth of each concave groove is more than 300 μm and the diameter of the probe is 20 μm to 50 μm.

8. The probe head according to claim 1, wherein the head body has a cover for covering the concave groove, and the probe can be buckled in a space defined between the cover and the concave groove.

9. A probe head for inspecting electrical properties of an object, said probe head comprising:
    an insulating substrate with a plurality of electrically conductive patterns formed thereon;
    a plurality of probes, each of the probes being formed from a wire, and including a proximal end wire-bonded to a corresponding one of said conductive patterns on the insulating substrate and a free end for contacting an electrode pad of the object; and
    a head body for accommodating the probes.

10. A method for manufacturing a probe head for inspecting electrical properties of an object, said method comprising:
    wire-bonding a first end of each of a plurality of wires to a conductive pattern formed on an insulating substrate;
    extending the wires over a head body;
    wire-bonding a second end of each of the wires to a dummy substrate;
    engaging each of the wires, with both ends thereof bonded to the substrates, in a groove of the head body; and
    cutting the second end from each of the wire so that each of the wires is usable as a probe.

11. The method for manufacturing a probe head according to claim 10, further including forming the groove by cutting with a dicing saw.

12. The method for manufacturing a probe head according to claim 10, wherein the maximum depth of the groove is more than 300 μm and the diameter of the probes is 20 μm to 50 μm.

13. The method for manufacturing a probe head according to claim 10, wherein the maximum depth of the groove is more than 500 μm.

14. The probe head according to claim 1, wherein a maximum depth of each concave groove is more than 500 μm.

* * * * *